US006066563A

United States Patent [19]

Nagashima

[11] Patent Number: 6,066,563

[45] Date of Patent: May 23, 2000

[54] METHOD FOR MANUFACTURING SEMICONDUCTOR DEVICE

[75] Inventor: Naoki Nagashima, Kanagawa, Japan

[73] Assignee: Sony Corporation, Tokyo, Japan

[21] Appl. No.: 09/009,879

[22] Filed: Jan. 21, 1998

[30] Foreign Application Priority Data

Jan. 22, 1997 [JP] Japan .................................... 9-009642

[51] Int. Cl.[7] ...................... H01L 21/302; H01L 21/8238

[52] U.S. Cl. .......................... 438/692; 438/231; 438/563

[58] Field of Search .................................... 438/199, 275, 438/548, 558, 563, 564, 559, 299, 231, 232, 692

[56] References Cited

U.S. PATENT DOCUMENTS

| | | | |
|---|---|---|---|
| 4,555,842 | 12/1985 | Levinstein et al. | 438/232 |
| 4,786,611 | 11/1988 | Pfiester | 438/233 |
| 5,116,778 | 5/1992 | Haskell et al. | 438/548 |
| 5,244,835 | 9/1993 | Hachiya | 438/672 |
| 5,352,625 | 10/1994 | Hoshi | 438/430 |
| 5,637,525 | 6/1997 | Dennison | 438/564 |
| 5,723,357 | 3/1998 | Huang | 438/199 |
| 5,770,490 | 6/1998 | Frenette et al. | 438/199 |
| 5,780,330 | 7/1998 | Choi | 438/232 |
| 5,880,039 | 3/1999 | Lee | 438/692 |
| 5,897,364 | 4/1999 | Pan | 438/563 |

*Primary Examiner*—Carl Whitehead, Jr.
*Assistant Examiner*—Jeff Vockrodt
*Attorney, Agent, or Firm*—Hill & Simpson

[57] ABSTRACT

A manufacturing method of a complementary MOS transistor capable of providing line width stability at the time of lithography of gate patterning and suppressing punch through of an impurity from the silicon gate electrode to the side of a substrate is proposed. A method for manufacturing a semiconductor device having a complementary MOS transistor includes the steps of forming a poly-crystalline semiconductor film (6) serving as a gate electrode on one major surface of a semiconductor substrate (3), (4) via a gate insulation film (5), forming a first solid phase diffusion source (7) containing an impurity of a first conduction type selectively on a portion of the poly-crystalline semiconductor film (6) corresponding to a first channel MOS transistor forming region (4), forming a second solid phase diffusion source (9) containing impurities of a second conduction type on an entire surface including a surface of the first solid phase diffusion source (7) and a surface of the poly-crystalline semiconductor film (6) corresponding to a second channel MOS transistor forming region (3), polishing the second solid phase diffusion source (9) by a chemical mechanical polishing technique to a position where the first solid phase diffusion source (7) is exposed, and patterning the poly-crystalline semiconductor film (6) together with the first solid phase diffusion source (7) and the second solid phase diffusion source (9) to attain a gate electrode pattern.

4 Claims, 5 Drawing Sheets

METHOD FOR MANUFACTURING SEMICONDUCTOR DEVICE

BACKGROUND OF THE INVENTION

The present invention relates to a method for manufacturing a semiconductor device, and in particular to a semiconductor device having a complementary MOS transistor As a semiconductor device, a semiconductor integrated circuit including a so-called complementary MOS transistor in which a n-channel MOS transistor and a p-channel MOS transistor are combined is widely used.

Recently, due to reduction in a gate length of a MOS transistor caused by miniaturization of such a semiconductor integrated circuit, the short channel effect causing a drop in a threshold voltage Vth poses a problem.

Especially in the p-channel MOS transistor, the short channel effect poses a serious problem.

Heretofore, for both the n-channel MOS transistor and the p-channel MOS transistor, an n-type impurity was used as an impurity contained in the gate electrode of poly-crystalline silicon by ion implantation, and the p-channel MOS transistor was made as a buried channel type. Recently, however, it has been attempted to suppress the short channel effect by using a p-type impurity as the impurity contained in the gate electrode of the p-channel MOS transistors to make the p-channel MOS transistors as a MOS transistor of a surface channel type.

However, the following problem was caused when the p-type impurity was used as the impurity contained in the gate electrode and especially when boron (B) was used. The concentration of the impurity in the gate electrode was high so that if the film thickness of a gate oxide film was made thinner, therefore, the impurity was diffused into a semiconductor substrate via the gate oxide film by the thermal load in the manufacturing process. As a result, characteristics of the transistors were changed and so on, resulting in a problem.

As a method for suppressing such diffusion of the impurity, there is a method of diffusing an impurity from an insulating film containing the impurity onto a poly-crystalline silicon film serving as the gate electrode, and thereby attempting to secure the diffusion length of the impurity and optimize the initial distribution.

In this known method, however, an insulating film containing an impurity of an n-type or a p-type was selectively removed, and thereafter ion implantation was conducted, or an insulation film containing the impurity of an opposite polarity was deposited. On a wafer surface at the time when the gate electrode was processed, therefore, there occurred a step between the n-type region and the p-type region. This resulted in many problems, such as nonuniformity in the thickness of a film photoresist film at the time of execution of lithography and pattern deformation caused by reflected light at the time of exposure or the like.

SUMMARY OF THE INVENTION

In view of the above described points, an object of the present invention is to provide a manufacturing method of a semiconductor device capable of providing line width stability at the time of lithography of gate patterning and suppressing punch through of an impurity from a gate electrode to a substrate side.

In accordance with the present invention, a method for manufacturing a semiconductor device includes forming a poly-crystalline semiconductor film serving as a gate electrode, then forming a first solid phase diffusion source containing an impurity of a first conduction type selectively on a portion of the poly-crystalline semiconductor film corresponding to a first channel MOS transistor forming region, then forming a second solid phase diffusion source containing an impurity of a second conduction type on an entire surface including a surface of the first solid phase diffusion source and a surface of the poly-crystalline semiconductor film corresponding to a second channel MOS transistor forming region, polishing the second solid phase diffusion source by a chemical mechanical polishing technique to a position where the first solid phase diffusion source is exposed, and then patterning the poly-crystalline semiconductor film together with the first solid phase diffusion source and the second solid phase diffusion source to attain a gate electrode pattern.

According to this manufacturing method, the first solid phase diffusion source and the second solid phase diffusion source are formed to have the same plane by the chemical mechanical polishing and no step difference therebetween. Since patterning of the gate electrodes is conducted in this state, line width variation can be prevented. Since impurities are then diffused from the first solid phase diffusion source and the second solid phase diffusion source to respective corresponding poly-crystalline semiconductor films, diffusion (i.e., so-called punch through) of impurities from the gate electrodes to the semiconductor substrate is prevented in subsequent heat treatment processes.

DETAILED DESCRIPTION OF THE PREFERRED EMBODIMENTS

Hereafter, an embodiment of a method for manufacturing a semiconductor device according to the present invention will be described.

Figure 1A:
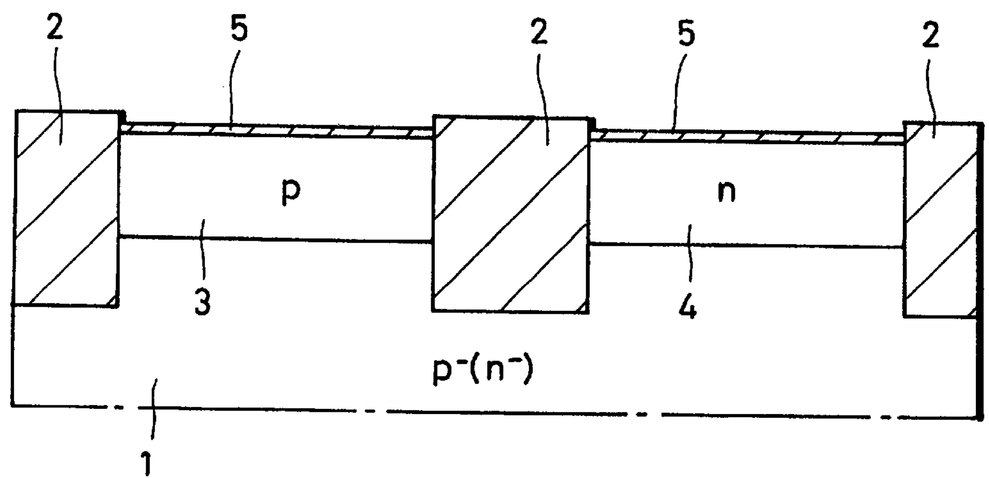
FIG. 1A is a manufacturing process diagram showing an embodiment of a method for manufacturing a semiconductor device according to the present invention.

First of all, a device separation layer 2 of $SiO_2$ is formed on a silicon semiconductor substrate 1 of a first conductivity such as a p-type or an n-type by using a known method as shown in FIG. 1A. Subsequently, a p-type semiconductor well region 3 and an n-type semiconductor well region 4 are selectively formed in respective regions separated by the device separation layers 2 via a mask formed by using a lithography technique. In other words, the p-type semiconductor well region 3 corresponds to an n-channel MOS transistor forming region, and the n-type semiconductor well region 4 corresponds to a p-channel MOS transistor forming region. Furthermore, the surface of each of the semiconductor well regions 3 and 4 is subjected to gate oxidation to form a silicon oxide film ($SiO_2$), i.e., a gate insulation film 5 having a film thickness of, for example, 5 nm.

Figure 1B:
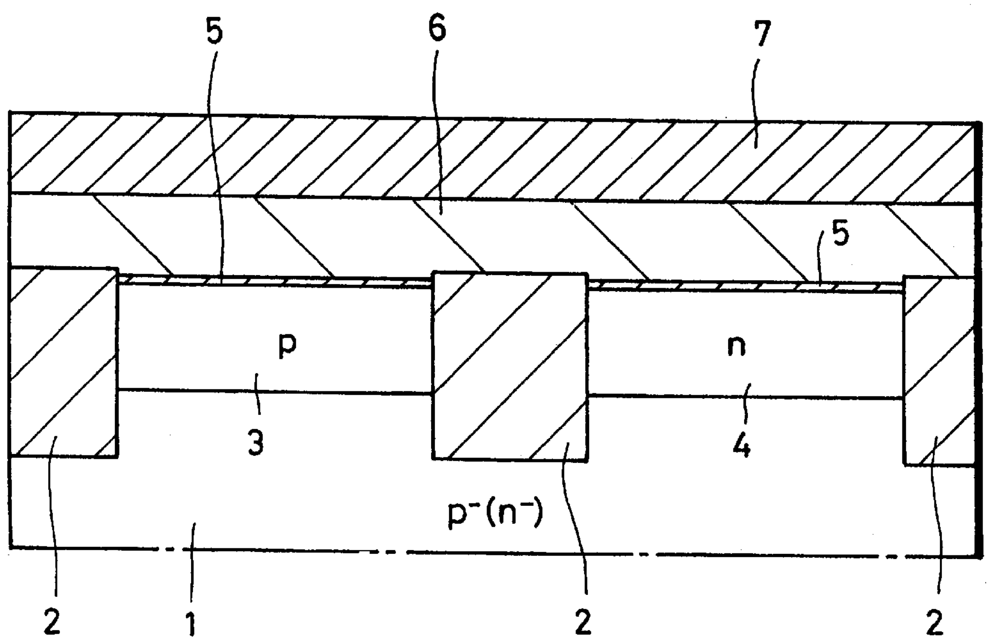
FIG. 1B is a manufacturing process diagram showing the embodiment of the method for a manufacturing semiconductor device according to the present invention.

Subsequently, a poly-crystalline silicon film 6 serving as a gate electrode and having a film thickness of, for example, approximately 200 nm is deposited on the entire surface including the semiconductor well regions 3 and 4 as shown in FIG. 1B. On the poly-crystalline silicon film 6, a silicon oxide film having a film thickness of, for example, approximately 150 nm and containing a boron as a p-type impurity, i.e., a BSG (boron silicate glass) film 7 is sequentially deposited. This BSG film 7 serves as a solid phase diffusion source of the boron.

Figure 2C:
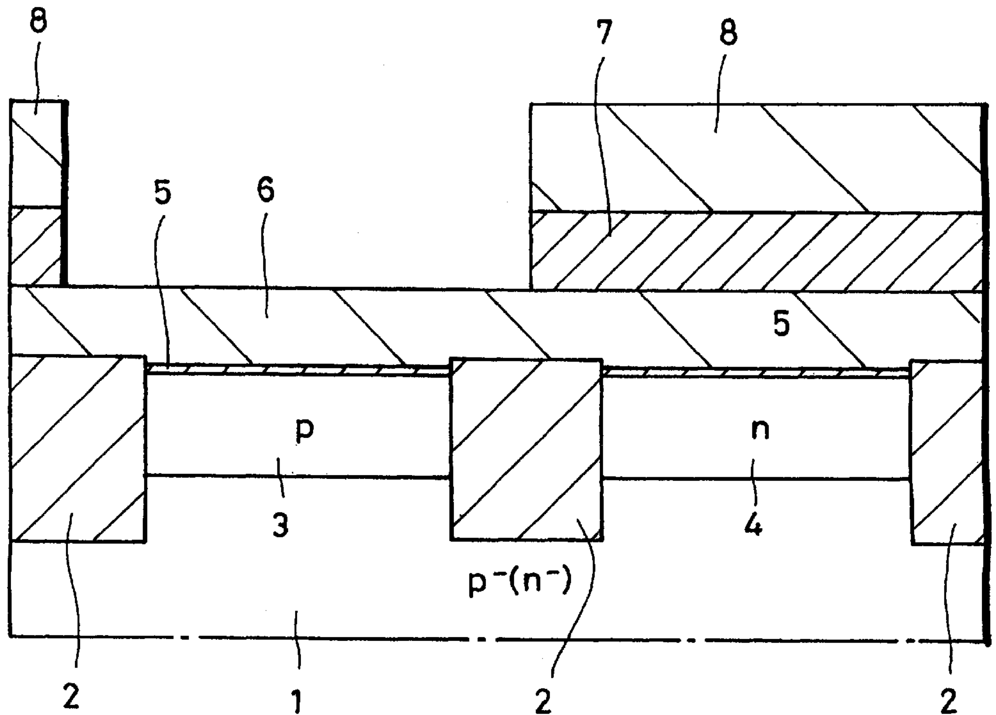
FIG. 2C is a manufacturing process diagram showing the embodiment of the method for manufacturing a semiconductor device according to the present invention.

Next as shown in FIG. 2C, a photoresist mask 8 is then formed selectively on a portion of the BSG film 7 corresponding to the n-type semiconductor well region 4 by using the lithography technique. Via this photoresist mask 8, a portion of the BSG film 7 corresponding to the p-type semiconductor well region 3 is selectively removed by using anisotropic etching.

Figure 2D:
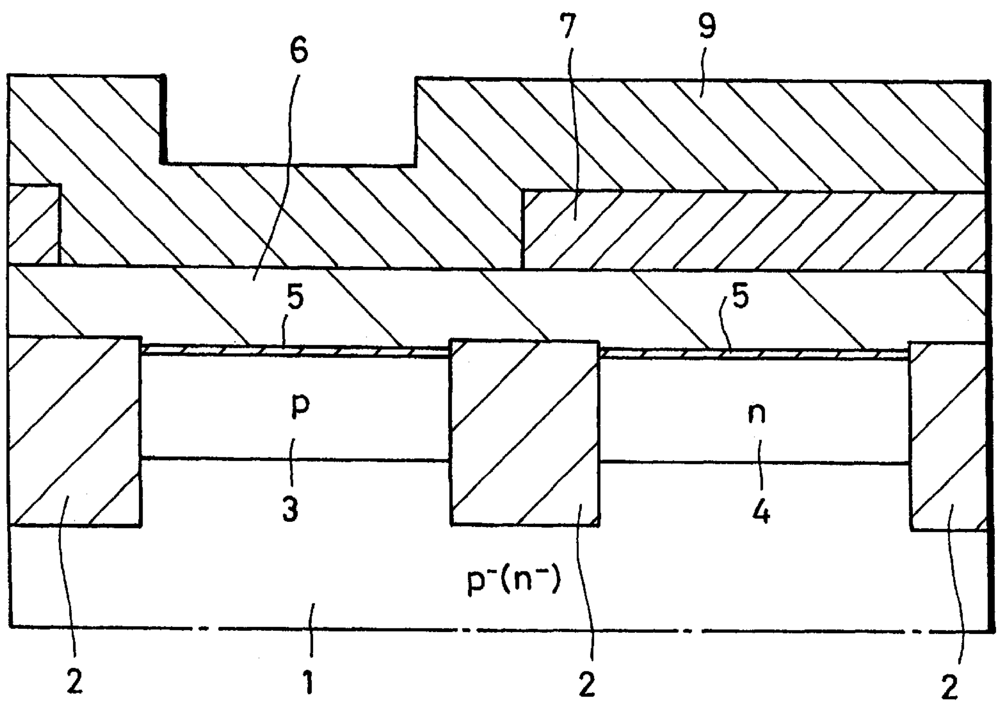
FIG. 2D is a manufacturing process diagram showing an embodiment of the method for manufacturing a semiconductor device according to the present invention.

Subsequently, as shown in FIG. 2D the photoresist mask 8 is removed and then on the entire surface including the surface of the poly-crystalline silicon film 6 corresponding to the p-type semiconductor well region 3 and the surface of the BSG film 7 corresponding to the n-type semiconductor well region 4, a silicon oxide film having a film thickness of approximately 150 nm and containing phosphorus as an n-type impurity, i.e., a PSG (phosphorus silicate glass) film 9 is then deposited. This PSG film 9 serves as a solid phase diffusion source of phosphorus.

Figure 3E:
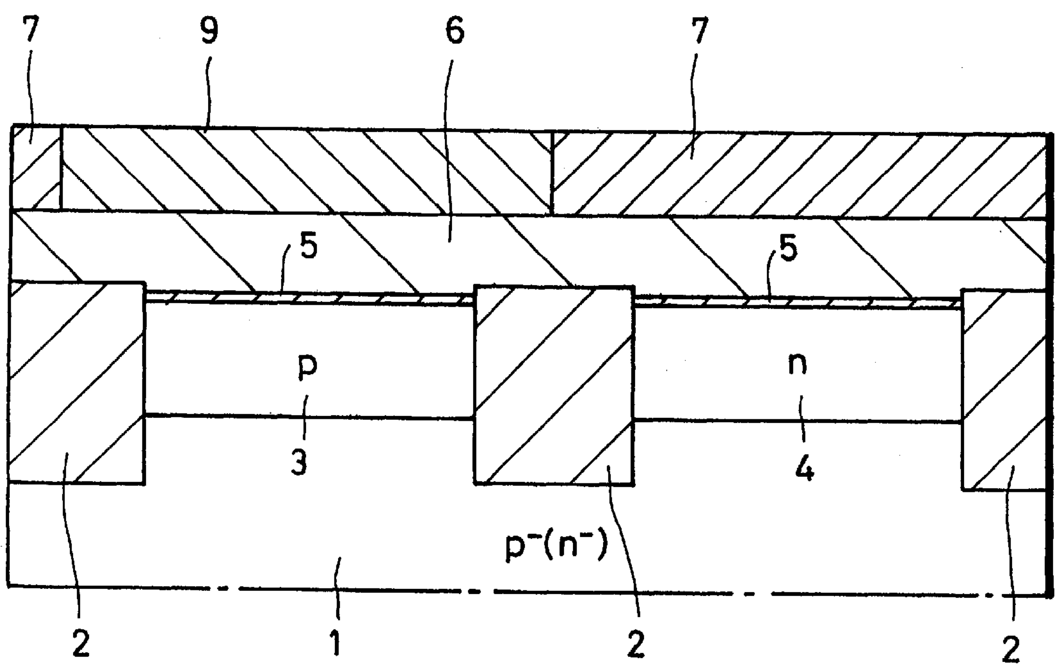
FIG. 3E is a manufacturing process diagram showing the embodiment of the method for manufacturing a semiconductor device according to the present invention.

Subsequently, the PSG film 9 is polished by using a chemical and mechanical polishing technique until the top surface of the BSG film 7 is exposed as shown in FIG. 3E. If at this time the polishing conditions are chosen so that the polishing speed will become lower on the BSG film 7 than on the PSG film 9, the polishing speed suddenly falls when the polishing has arrived at the top surface of the BSG film 7. Therefore, the amount of polishing is substantially determined by the thickness of the BSG film 7. The amount of polishing thus does not significantly depend upon the in-plane dependence of the polishing speed, and it becomes constant.

By this polishing, the PSG film 9 corresponding to the p-type semiconductor well region 3 and the BSG film 7 corresponding to the n-type semiconductor well region 4 are formed on the same plane so as to have the same film thickness.

Figure 3F:
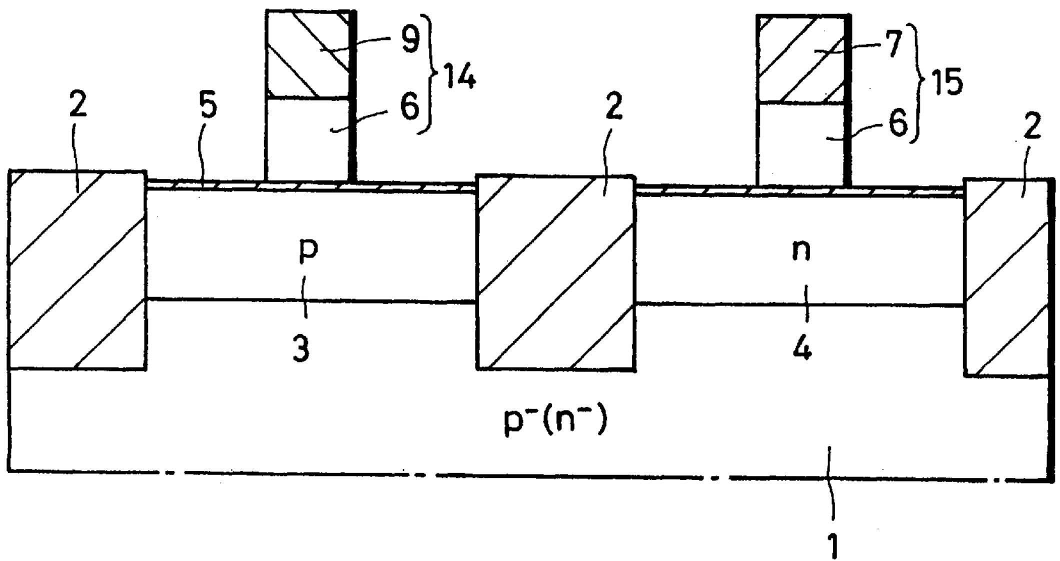
FIG. 3F is a manufacturing process diagram showing the embodiment of the method for manufacturing a semiconductor device according to the present invention.

Next as shown in FIG. 3F, the BSG film 7 and the PSG film 9 are then subjected to patterning using the anisotropic etching via a photoresist mask (not illustrated) of a gate pattern formed by using the lithography technique. Furthermore, the underlying poly-crystalline silicon film 6 is subjected to patterning using the anisotropic etching to for on the p-type semiconductor well region 3 and the n-type semiconductor well region 4, gate electrode forming portions 14 and 15, respectively. Then, the photoresist mask (not illustrated) is removed.

At the time of the lithography process for forming the photoresist mask, since the surface substrate on which the PSG film 9 and the BSG film 7 are formed is flat, a change in line width caused by a change in photoresist film thickness, reflection and the like can be suppressed.

Figure 4G:
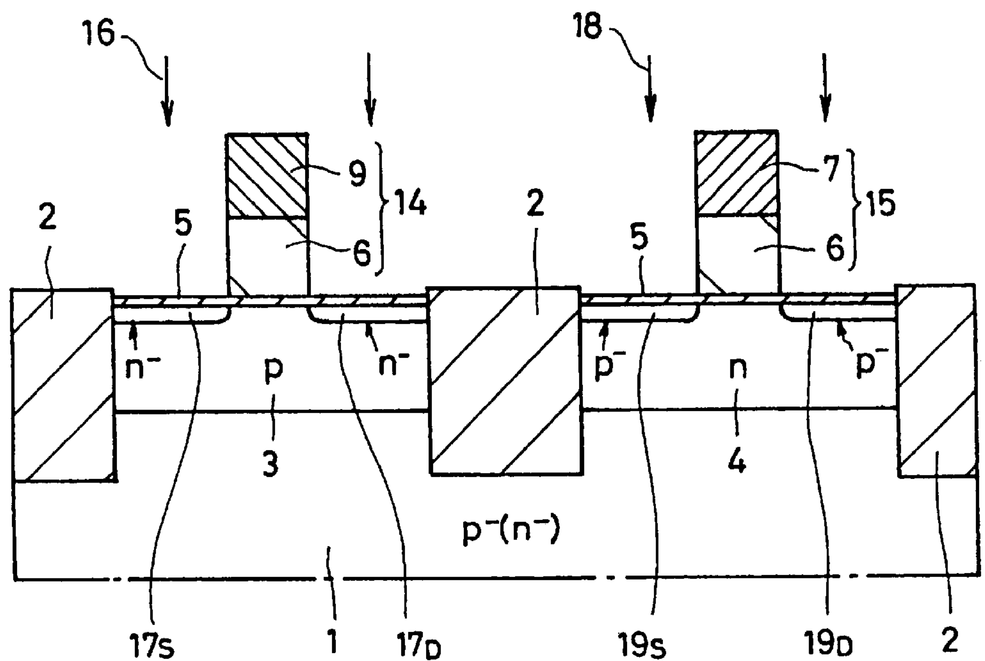
FIG. 4G is a manufacturing process diagram showing the embodiment of the method for manufacturing a semiconductor device according to the present invention.

Subsequently, ion implantation for a LDD is selectively conducted as shown in FIG. 4G. That is, by using the gate electrode forming portion 14 as the mask, ion implantation of n-type impurities 16 is conducted for the p-type semiconductor well region 3. Low concentration impurity regions 17S and 17D of n type functioning as LDD regions are thus formed in self-alignment. By using the gate electrode forming portion 15 as the mask, ion implantation of a p-type impurity 18 is conducted for the n-type semiconductor well region 4. Low concentration impurity regions 19S and 19D of the p-type serving as LDD regions are thus formed in self-alignment.

Figure 4H:
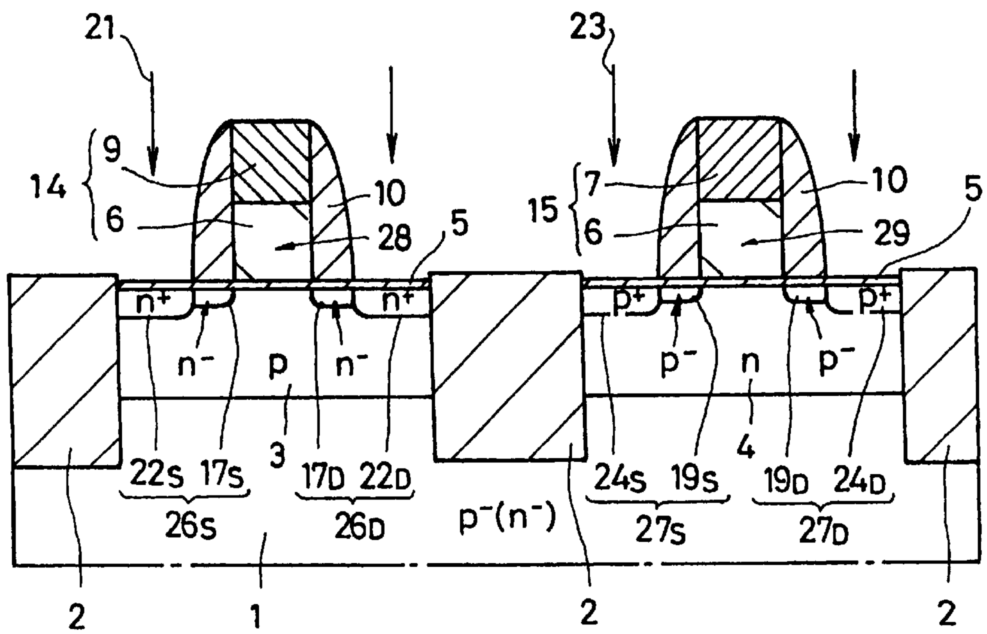
FIG. 4H is a manufacturing process diagram showing the embodiment of the method for manufacturing a semiconductor device according to the present invention.

Next as shown in FIG. 4H, a silicon nitride film is formed so as to have a film thickness of, for example, approximately 150 nm by deposition. Then, etch back is conducted by using the anisotropic etching. A side wall portion 10 of the silicon nitride film is thus formed on side walls of the gate electrode forming portions 14 and 15.

Subsequently, ion implantation for a source and a drain is conducted selectively. By using the gate electrode forming portion 14 and the side wall portions 10 as the mask, ion implantation of an n-type impurity 21 is conducted for the p-type semiconductor well region 3. High concentration impurity regions 22S and 22D of the n-type are thus formed in self-alignment. By using the gate electrode forming portion 15 and the side wall portions 10 as the mask, ion implantation of a p-type impurity 23 is conducted for the n-type semiconductor well region 4. High concentration impurity regions 24S and 24D of the p-type are thus formed in self-alignment.

In the p-type semiconductor well region 3, an n-type source region 26S of an LDD structure is formed by the low concentration impurity region 17S and the high concentration impurity region 22S, and an n-type drain region 26D of an LDD structure is formed by the low concentration impurity region 17L and the high concentration impurity region 22D.

In the n-type semiconductor well region 4, a p-type source region 27S of an LDD structure is formed by the low concentration impurity region 19S and the high concentration impurity 24S, and a p-type drain region 27D of an LDD structure is formed by the low concentration impurity region 19D and the high concentration impurity region 27D, respectively.

Subsequently, ramp anneal is conducted in, for example, $N_2$ atmosphere at 950° C. for 10 seconds. The source regions 26S and 27S and the drain regions 26D and 27D formed by the ion implantation are thus subjected to activation processing.

At the same time, the phosphorus from the PSG film 9 in the gate electrode forming portion 14 is diffused into the poly-crystalline silicon film 6 by the ramp anneal (heat treatment), whereby a poly-crystalline gate electrode 28 of the n-channel MOS transistor is formed. In the gate electrode forming portion 15, boron from the BSG film 7 is diffused into the poly-crystalline silicon film 6 whereby a poly-crystalline gate electrode 29 of the p-channel MOS transistor is formed.

Figure 5I:
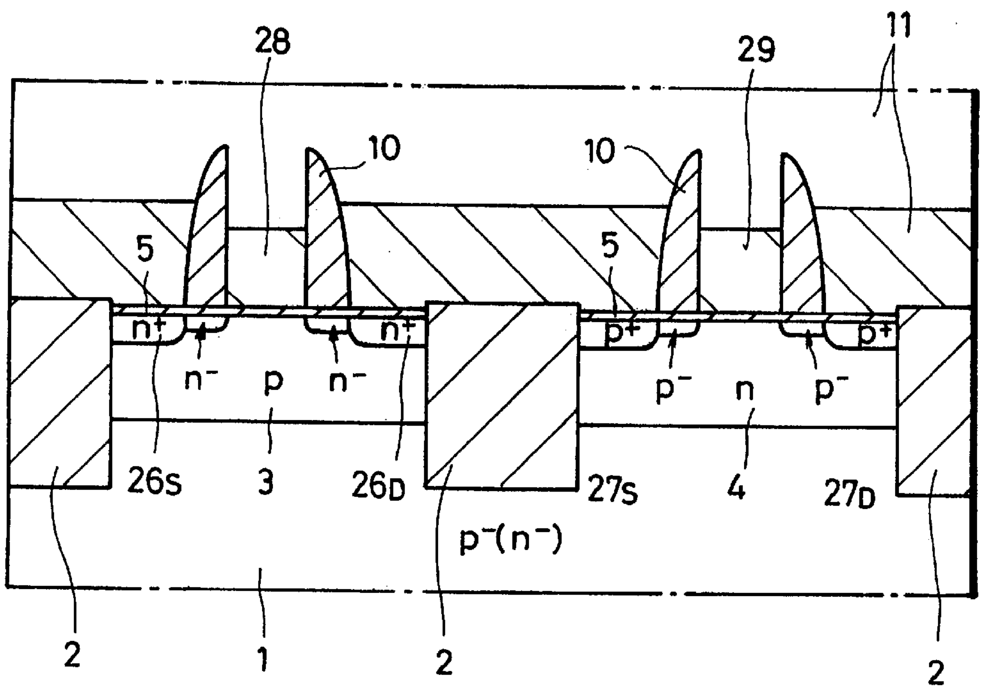
FIG. 5I is a manufacturing process diagram showing the embodiment of the method for manufacturing a semiconductor device according to the present invention.

Then, as shown in FIG. 5I, a photoresist layer 11 is then coated so as to have a thickness of, for example, approximately 500 nm. Thereafter, the photoresist layer 11 is etched back until the PSG film 9 of the gate electrode forming portion 14 and the BSG film 7 of the gate electrode forming portion 15 are exposed. Furthermore, etching is conducted under such a condition that the etching speed of the PSG film 9 and the BSG film 7 is approximately 20 times higher than that of the silicon nitride films of the side wall portions 10. Furthermore, etching is conducted by using dilute fluoric acid to thereby remove the PSG film 7 and the BSG film 7 of the respective portions, selectively removed. The etching condition using the dilute fluoric acid is, for example, a solution with the ratio of water:fluoric acid=100:5 for 60 seconds.

Figure 5J:
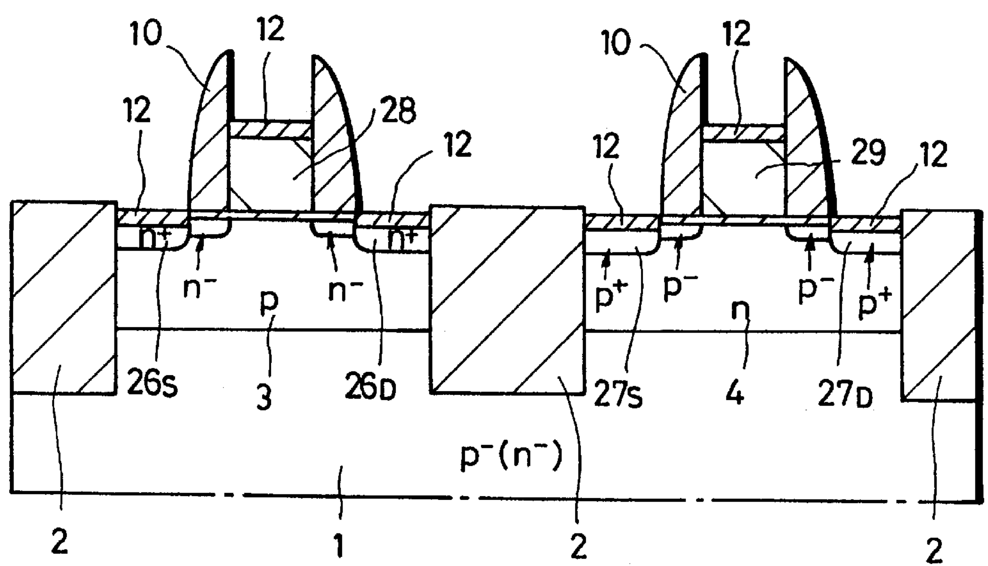
FIG. 5J is a manufacturing process diagram showing the embodiment of the method for manufacturing a semiconductor device according to the present invention.

Subsequently, as shown in FIG. 5J, the photoresist layer 11 is removed. Thereafter, metal having a high melting point, such as cobalt, is deposited so as to have a film thickness of approximately 20 nm. Then ramp anneal is conducted, for example, at 550° C. for 30 seconds to form on the surfaces of the source regions 26S and 27S, the drain regions 26D and 27D, and the gate electrodes 28 and 29, cobalt silicide films 12, respectively. Thereafter, cobalt films which have not reacted are removed by sulfuric acid water.

As a result, the cobalt silicide films 12 remain on only the surfaces of the source regions 26S and 27S, the drain regions 26D and 27D, and the gate electrodes 28 and 29.

Thus, in the p-type semiconductor well region 3, an n-channel MOS transistor 31 having the n-type source region 26S and drain region 26D, and the gate electrode 28 doped with phosphorus is formed, while in the n-type semiconductor well region 4, a p-channel MOS transistor 32 having the p-type source region 27S and drain region 27D, and the gate electrode doped with boron is formed thus a complementary MOS transistor is obtained.

Thereafter, deposition for an inter-layer insulation film and wiring are conducted to complete the complimentary MOS transistor.

According to the above described embodiment, the BSG film 7 serving as the solid phase diffusion source of the boron (B) is formed selectively on the poly-crystalline silicon film 6 serving as the gate electrode in the process shown in FIG. 2C, and in the process of FIG. 2D, the PSG film 9 serving as the solid phase diffusion source of the phosphorus (P) is formed on the entire surface including the top surface of the BSG film 7. Thereafter, in the process of FIG. 3E, the PSG film 9 is polished by the chemical mechanical polishing until the top surface of the BSG film 7 is exposed. As a result, the PSG film 9 and the BSG film 7 are formed with the same surface without a step difference between them.

At the next process of forming the photoresist corresponding to the gate electrode pattern, therefore, the photoresist mask can be formed with uniform film thickness. At the time of exposure to light as well, exposure is conducted uniformly. It is possible to suppress the line width change of the gate pattern caused by a change in photoresist film thickness and reflection at the time of exposure which occur when a step difference is present. As a result, the gate electrode forming portions 14 and 15 each free from a change in line width are obtained as shown in FIG. 3F.

Furthermore, since the oxide film on the gate poly-silicon is uniform, the etching process margin of the BSG film and the PSG film 9 is expanded. In addition, since the gate electrodes 14 and 15 have the same height, the widths of the gate side wall portions 10 can be formed with equal width.

The gate electrodes 28 and 29 made of the poly-crystalline silicon films 6 are formed by impurity diffusion of the boron and the phosphorus respectively from the BSG film 7 and the PSG film 9 serving as the solid phase diffusion sources, respectively, so that in the subsequent heat processes such as formation of the inter-layer insulation film, and so on diffusion, i.e., so-called punch through, of impurities, especially the boron of the p-type impurity from the gate electrodes 28 and 29 toward the side of the semiconductor well regions can be prevented. Therefore, the margin for the thermal load during the manufacturing processes can be increased.

Furthermore, since the cobalt silicide films 12 are formed on the surfaces of the source regions 26S and 27S, the drain regions 26D and 27D, and the gate electrodes 28 and 29, in spite of shallow junctions, the resistance values of the source regions 26S and 27S and the drain regions 26D and 27D can be lowered, and the gate electrodes each having a low resistance value are obtained.

Therefore, it becomes possible to form both the n-channel MOS transistor and the p-channel MOS transistor as the MOS transistor of the surface channel type capable of suppressing the short channel effect caused by reduction in gate length. It thus becomes possible to manufacture a highly reliable complementary MOS transistor.

In the above described example, the BSG film 7 is selectively formed earlier and thereafter the PSG film 9 is formed on the entire surface. Alternatively, however, the BSG film 7 may be formed on the entire surface after preceding selective forming of the PSG film 9 and the BSG film 7 may be polished by the chemical mechanical polishing until the top surface of the PSG film 9 is exposed.

According to the semiconductor device manufacturing method of the present invention, the gate electrodes with diffusion of the impurity to the semiconductor regions suppressed can be formed while suppressing the line width change in forming the gate pattern by using the photoresist. The margin for the thermal load during the manufacturing processes can be increased.

Therefore, the semiconductor device having the highly reliable complementary MOS transistor can be manufactured.

Having described the preferred embodiment of the present invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A method for manufacturing a semiconductor device having a complementary MOS transistor, comprising the steps of:

forming a poly-crystalline semiconductor film serving as a gate electrode on one major surface of a semiconductor substrate via a gate insulation film;

forming a first solid phase diffusion source containing an impurity of a first conduction type selectively on a portion of said poly-crystalline semiconductor film corresponding to a first channel MOS transistor forming region;

forming a second solid phase diffusion source containing an impurity of a second conduction type on an entire surface including a surface of said first solid phase diffusion source and a surface of said poly-crystalline semiconductor film corresponding to a second channel MOS transistor forming region;

polishing said second solid phase diffusion source by a, chemical mechanical polishing technique to a position where said first solid phase diffusion source is exposed; and patterning said poly-crystalline semiconductor film together with said first solid phase diffusion source and said second solid phase diffusion source to attain a gate electrode pattern.

2. A method for manufacturing a semiconductor device according to claim 1, further comprising a step of:

after said patterning process, forming a gate electrode of a first channel MOS transistor and a gate electrode of the second channel MOS transistor by diffusing the impurities to respective poly-crystalline semiconductor films from said first solid phase diffusion source and said second solid phase diffusion source, respectively.

3. A method for manufacturing a semiconductor device according to claim 1, wherein said second solid phase diffusion source is polished under a polishing condition that a polishing speed of the said first solid phase diffusion source is later than a polishing speed of said second solid phase diffusion source.

4. A method for manufacturing a semiconductor device according to claim 1, wherein a silicon oxide film with a boron added thereto is used in one of said first and second solid phase diffusion sources, and a silicon oxide film with a phosphorus added thereto is used as the other of said first and second solid phase diffusion sources.

* * * * *